(12) United States Patent
Jang et al.

(10) Patent No.: US 10,008,697 B2
(45) Date of Patent: Jun. 26, 2018

(54) ORGANIC LIGHT EMITTING DIODE DISPLAY DEVICE

(71) Applicant: LG DISPLAY CO., LTD., Seoul (KR)

(72) Inventors: Jihyang Jang, Goyang-si (KR); Sookang Kim, Paju-si (KR); Soyoung Jo, Seoul (KR); Wonhoe Koo, Goyang-si (KR); Hyunsoo Lim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/252,053

(22) Filed: Aug. 30, 2016

(65) Prior Publication Data

US 2017/0062770 A1 Mar. 2, 2017

(30) Foreign Application Priority Data

Aug. 31, 2015 (KR) ........................ 10-2015-0123173
May 31, 2016 (KR) ........................ 10-2016-0067665

(51) Int. Cl.
  *H01L 51/52* (2006.01)
  *H01L 51/50* (2006.01)
  *H01L 51/56* (2006.01)
  *H01L 27/32* (2006.01)

(52) U.S. Cl.
CPC ...... *H01L 51/5275* (2013.01); *H01L 27/3246* (2013.01); *H01L 27/3258* (2013.01); *H01L 51/5012* (2013.01); *H01L 51/5206* (2013.01); *H01L 51/5221* (2013.01); *H01L 51/5271* (2013.01); *H01L 51/5281* (2013.01); *H01L 51/5293* (2013.01); *H01L 51/56* (2013.01); *H01L 27/322* (2013.01); *H01L 51/5209* (2013.01); *H01L 51/5225* (2013.01); *H01L 2227/323* (2013.01)

(58) Field of Classification Search
CPC ............. H01L 27/3246; H01L 27/3258; H01L 51/5012; H01L 51/5206; H01L 51/5221; H01L 51/5271; H01L 51/5275; H01L 51/5281; H01L 51/5293; H01L 51/56
See application file for complete search history.

(56) References Cited

U.S. PATENT DOCUMENTS

| 9,673,264 B2* | 6/2017 | Ohsawa | ................ H01L 27/322 |
| 2007/0236425 A1 | 10/2007 | Furuie et al. | |
| 2012/0080710 A1* | 4/2012 | Inoue | .................... G02B 5/045 257/98 |

(Continued)

FOREIGN PATENT DOCUMENTS

| JP | 2002008870 A | 1/2002 |
| JP | 2006-164808 A | 6/2006 |

(Continued)

*Primary Examiner* — Allan R Wilson
(74) *Attorney, Agent, or Firm* — Dentons US LLP

(57) ABSTRACT

Provided is an organic light emitting diode display device. The organic light emitting diode display device includes a polarizing plate, a substrate disposed on the polarizing plate, an overcoating layer disposed on the substrate and including a plurality of micro lenses, and a first electrode, an organic emission layer, and a second electrode of an organic emission element which is disposed on the overcoating layer, in which the micro lens includes a plurality of recesses and a wall surrounding the recesses and a reflective pattern is disposed in an area corresponding to the recess.

21 Claims, 11 Drawing Sheets

(56) References Cited

U.S. PATENT DOCUMENTS

| | | | |
|---|---|---|---|
| 2012/0205685 A1* | 8/2012 | Seo | H01L 51/5044 257/89 |
| 2013/0069046 A1* | 3/2013 | Ishizuya | H01L 51/5271 257/40 |
| 2015/0060840 A1* | 3/2015 | Nishimura | H01L 51/5275 257/40 |
| 2015/0090992 A1 | 4/2015 | Miyazawa et al. | |
| 2015/0200382 A1* | 7/2015 | Moon | H01L 51/5271 257/40 |
| 2015/0380466 A1* | 12/2015 | Koo | H01L 27/3258 257/40 |

FOREIGN PATENT DOCUMENTS

| | | |
|---|---|---|
| TW | 200423817 A | 11/2004 |
| TW | I231726 B | 11/2004 |
| TW | 201240178 A1 | 10/2012 |

\* cited by examiner

ORGANIC LIGHT EMITTING DIODE DISPLAY DEVICE

CROSS-REFERENCE TO RELATED APPLICATIONS

This application claims priority from Korean Patent Applications No. 10-2015-0123173, filed on Aug. 31, 2015, and No. 10-2016-0067665, filed on May 31, 2016, which are hereby incorporated by reference for all purposes as if fully set forth herein.

BACKGROUND

Field of the Disclosure

The present disclosure relates to an organic light emitting diode display device and a method of manufacturing the same, and more particularly, to an organic light emitting diode display device with enhanced light extraction efficiency.

Description of the Related Art

In general, an organic light emitting diode display device as a self-light emitting display device does not require a separate light source which is usually included in a liquid crystal display device such that the organic light emitting diode display device is thinly and lightly manufactured. Further, the organic light emitting diode display device is driven with low voltage and power consumption and excellent even in color expression, response speed, viewing angle, and contrast ratio (CR), and thus the organic light emitting diode display device has been researched as a next-generation display.

The light emitted from an organic emission layer of the organic light emitting diode display device passes through various constituent elements of the organic light emitting diode display device to travel to the outside. However, some of the light is trapped within the organic light emitting diode display device and does not travel to the outside; thus, there is a problem in light extraction efficiency of the organic light emitting diode display device.

Particularly, a total reflection or a light absorption occurs by an anode electrode in the organic light emitting diode display device having a bottom emission structure, and thus approximately 50% of the light emitted from the organic emission layer may be lost. Such a total reflection or a light absorption also occurs on the substrate and thus, approximately 30% of the light emitted from the organic emission layer may also be lost. As such, approximately 80% of the light emitted from the organic emission layer may be blocked in the organic light emitting diode display device and only approximately 20% of the light may travel to the outside, and thus the light efficiency is overly low.

In order to improve the light extraction efficiency of the organic light emitting diode display device, a method of attaching a micro lens array (MLA) on the outside substrate of the organic light emitting diode display device or forming a micro lens on an overcoating layer of the organic light emitting diode display device has been proposed.

However, in spite of introducing an MLA or a micro lens in the organic light emitting diode display device, the light blocked in organic light emitting diode display device may remain large and the light amount extracted to the outside may remain small. Further, a part of the light incident on the substrate may be reflected in the same state as a polarization axis of a polarizing plate by introducing an MLA or a micro lens. As a result, reflectivity of the organic light emitting diode display device may increase. Further, the light generated in the organic emission layer passes through the substrate to reach the polarizing plate and is reflected again in the polarizing plate, and thus a path of the light is converted in a substrate direction. Herein, a part of the light directed in the substrate direction may reach the micro lens of adjacent pixels emitting different colors of light to cause a light leakage phenomenon.

SUMMARY

Accordingly, the present disclosure is directed to provide an organic light emitting diode display device and a method for manufacturing the same that substantially obviate one or more problems due to limitations and disadvantages of the related art.

An advantage of the present disclosure is to provide an organic light emitting diode display device with enhanced light extraction efficiency.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

According to an aspect of the present disclosure, there is provided an organic light emitting diode display device including a polarizing plate, a substrate disposed on the polarizing plate, an overcoating layer disposed on the substrate and including a plurality of micro lenses, and a first electrode, an organic emission layer, and a second electrode of an organic emission element which is disposed on the overcoating layer, in which the micro lens includes a recess and a wall surrounding the recess and a reflective pattern is disposed in an area corresponding to the recess. In this case, a width of the reflective pattern may be smaller than a maximum width of the protrusion of the micro lens.

Further, the wall surrounding the recess may be constituted by a first wall and a second wall and the first wall and the second wall extended in a first direction with the first wall configure a protrusion of the micro lens. In this case, the first wall and the second wall may be symmetrical to each other based on a line vertical to the horizontal surface.

Further, in the organic light emitting diode display device of the present disclosure, the polarizing plate may have a polarization axis in a predetermined direction, and the light incident on the substrate through the polarizing plate may be reflected by the reflective pattern to be shifted in an opposite direction to the polarization axis of the polarizing plate.

Further, in the organic light emitting diode display device of the present disclosure, in the incident light in the area corresponding to the walls surrounding the recess, the light having an angle larger than a total reflection threshold angle may be reflected after reaching the polarizing plate to reach the reflective pattern at least once.

Further, in the organic light emitting diode display device of the present disclosure, in the light incident in the area corresponding to the wall surrounding the recess, the light incident at an angle of −30° to 30° based on the line vertical to a tangent line of the first wall or the second wall may reach the reflective pattern at least once.

According to one aspect of the present disclosure, an organic light emitting diode display device includes a substrate, an overcoating layer, an organic emission element and a reflective pattern. The overcoating layer is disposed on the substrate and includes a plurality of micro lenses. The organic emission element includes a first electrode, an organic emission layer and a second electrode. The organic emission element is disposed on the overcoating layer and has a curve according to the shape of the plurality of micro lenses, and each of the micro lenses includes a recess and a protrusion. The reflective pattern is disposed in an area corresponding to the recess.

According to one aspect of the present disclosure, the recesses of the micro lenses are spaced apart from each other by the protrusions of the micro lenses.

According to one aspect of the present disclosure, the recesses of the micro lenses and the protrusions of the micro lenses are alternately disposed.

According to one aspect of the present disclosure, each of the protrusions includes a slope, and an angle of the slope relative to a horizontal surface is 40° to 60°, or 120° to 140°.

According to one aspect of the present disclosure, the overcoating layer has at least one opening. The protrusion includes two convex portions spaced apart from each other by the at least one opening. The reflective pattern is disposed in a separation space corresponding to the at least one opening, and the separation space corresponds to the recess.

According to one aspect of the present disclosure, the organic light emitting diode display device further includes a polarizing plate. The reflective pattern is disposed between the organic emission layer and the polarizing plate.

According to one aspect of the present disclosure, refractive indices of the first electrode and the organic emission layer are larger than refractive indices of the overcoating layer and the substrate.

According to one aspect of the present disclosure, there is an emission light transmitted from the emission layer. The emission light is incident on a polarizing plate and is reflected by the polarizing plate to generate a reflection light. The reflective pattern is located on a path of the reflection light.

According to one aspect of the present disclosure, the protrusion includes two convex portions. A width of the reflective pattern is smaller than a distance between two centers of the two convex portions.

According to one aspect of the present disclosure, a width of the reflective pattern is smaller than a distance between two centers of two of the recesses that are adjacent to each other.

According to one aspect of the present disclosure, the reflective pattern is disposed between the overcoating layer and the substrate.

According to one aspect of the present disclosure, in the area corresponding to the recess, the reflective pattern is disposed on a color filter layer, the color filter layer is disposed on the substrate or an insulating layer, the substrate or the insulating layer is disposed on the thin film transistor.

According to one aspect of the present disclosure, in the area corresponding to the recess, the reflective pattern is disposed between the overcoating layer and the first electrode.

According to one aspect of the present disclosure, the organic light emitting diode display device further includes a bank pattern disposed between the overcoating layer and the first electrode, and the bank pattern defines an emission area and a non-emission area. The micro lenses is provided in an area corresponding to the emission area.

According to one aspect of the present disclosure, each of the micro lenses has a first area corresponding to the recess, a second area corresponding to a wall surrounding the recess, and a third area corresponding to a convex portion of the protrusion, and the reflective pattern is disposed in the area corresponding to the first area.

According to one aspect of the present disclosure, an organic light emitting diode display device includes a substrate, an overcoating layer, an organic emission element and a reflective pattern. The overcoating layer is disposed on the substrate, and the overcoating layer having a non-flat surface opposite to the substrate. The organic emission element includes a first electrode, an organic emission layer, and a second electrode. The organic emission element is disposed on the overcoating layer and has a curve according to the shape of the non-flat surface. The reflective pattern is disposed between the first electrode and the substrate.

As for the organic light emitting diode display device according to the present disclosure, a reflective pattern is disposed in an area corresponding to a recess of the micro lens, thereby reducing external light reflectivity in proportion to the displacement area of the reflective pattern.

Further, even in the case where light directed at a larger angle than a total reflection threshold angle is generated, the light does not reach the micro lens of a different pixel by the reflective pattern, thereby preventing a light leakage phenomenon.

Further, based on a line vertical to a straight line representing a slope of the second wall of the micro lens of the light generated from the organic emission element, up to the light directed at an angle between −30° to 30° is extracted to the outside of the substrate, thereby improving light efficiency.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
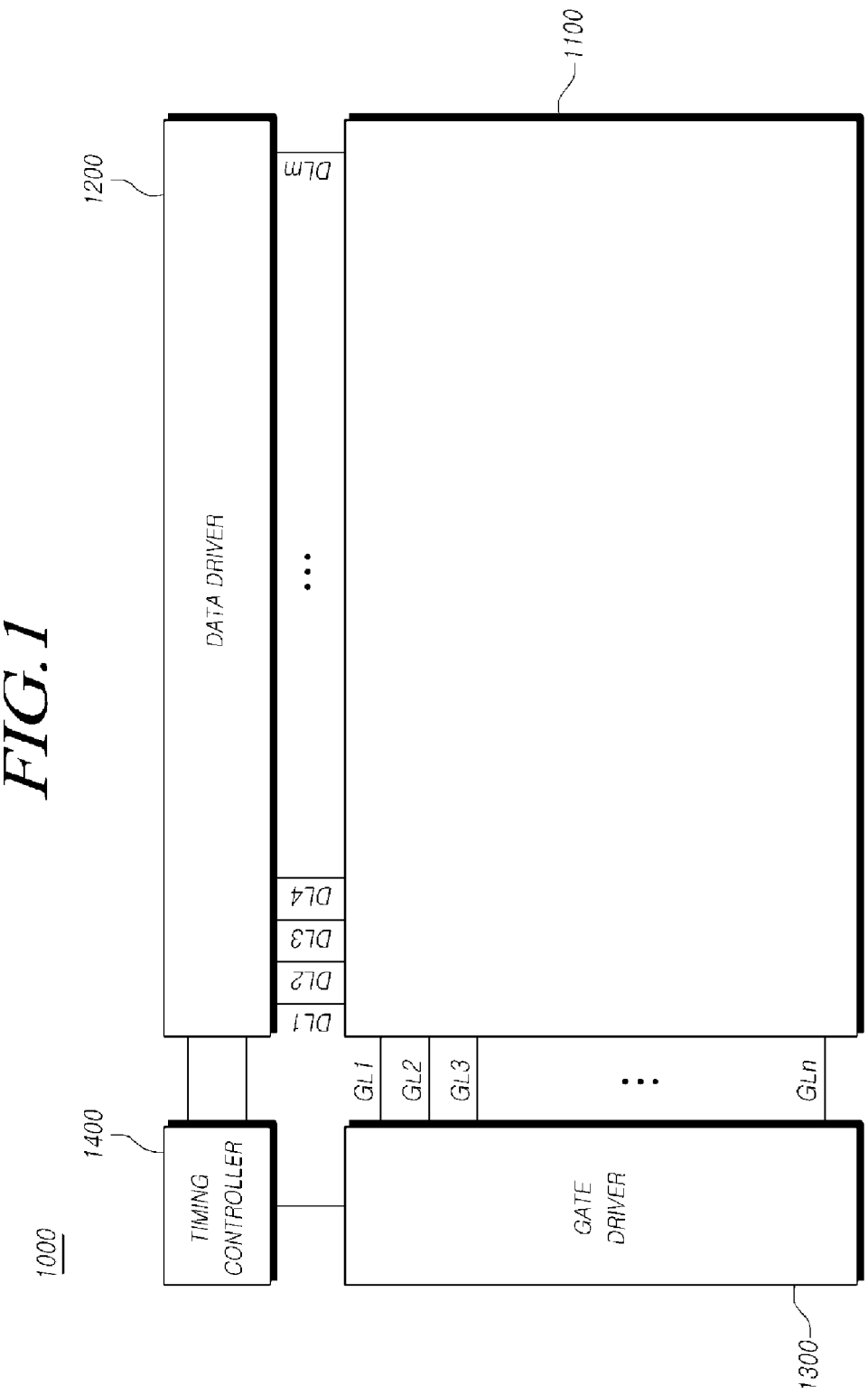
FIG. 1 is a schematic system configuration diagram of a display device according to an exemplary embodiment.

Hereinafter, exemplary embodiments of the present disclosure will be described with reference to the accompanying drawings. The following drawings are provided as examples so that this disclosure will fully convey the scope of the present disclosure to those skilled in the art. As those skilled in the art would realize, the described embodiments may be modified in various different ways, all without departing from the spirit or scope of the present disclosure. In addition, in the drawings, the size and the thickness of an apparatus may be exaggerated and expressed for easy description. Like reference numerals designate like elements throughout the specification.

Various advantages and features of the present disclosure and methods accomplishing thereof will become apparent from the following description of exemplary embodiments with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present disclosure will be defined by the appended claims. Throughout the whole specification, the same reference numerals denote the same elements. The size and relative size of the constituent elements marked in the drawings may be exaggerated for clarity of description.

When an element or a layer is referred to as being "on" another element or layer, it may be directly on the other element or layer, or intervening elements or layers may be present. On the contrary, designating that the elements are "directly on" or "just above" represents the case where other elements or layers are not interposed therebetween.

"Below", "beneath", "lower", "above", "upper", and the like which are spatially relative terms may be used to easily describe correlation between one element or component and other elements or components as illustrated in the drawings. The spatially relative terms should be appreciated as terms including different directions of the element in use or operation in addition to directions illustrated in the drawings. For example, when an element illustrated in the drawings is turned over, an element described to be "below" or "beneath" other elements may be laid "above" other elements. Accordingly, "below" which is an exemplary term may include both upper and lower directions.

Further, terms such as first, second, A, B, (a), and (b) may be used in describing the components of the exemplary embodiments according to the present disclosure. The terms are used to just distinguish the component from other components and the essence, sequence, or order of the corresponding component is not limited by the terms.

FIG. 1 is a schematic system configuration diagram of a display device according to exemplary embodiments.

Referring to FIG. 1, a display device 1000 includes a display panel 1100 where a plurality of data lines DL1 to DLm, a plurality of gate lines GL1 to GLn and a plurality of sub pixels are disposed, a data driver 1200 for driving the plurality of data lines DL1 to DLm, a gate driver 1300 for driving the plurality of gate lines GL1 to GLn, and a timing controller 1400 for controlling the data driver 1200 and the gate driver 1300.

The data driver 1200 supplies data voltages to the plurality of data lines DL1 to DLm to drive the plurality of data lines DL1 to DLm, and the gate driver 1300 sequentially supplies a scan signal to the plurality of gate lines GL1 to GLn to sequentially drive the plurality of gate lines GL1 to GLn.

Further, the timing controller 1400 supplies a control signal to the data driver 1200 and the gate driver 1300 to control the data driver 1200 and the gate driver 1300. The timing controller 1400 starts scanning the plurality of gate lines GL1 to GLn according to a timing implemented in each frame, converts input image data from the outside according to a data signal format used in the data driver 1200 to output the converted image data, and controls the data driving at an appropriate time according to the scanning.

The gate driver 1300 sequentially supplies a scan signal of on-voltage or off-voltage according to the control of the timing controller 1400 to the plurality of gate lines GL1 to GLn to sequentially drive the plurality of gate lines GL1 to GLn. The gate driver 1300 may be positioned only at one side of the display panel 1100 or may be positioned at both sides thereof, as illustrated in FIG. 1, in some cases depending on driving mode or design type of the display panel, or the like.

The gate driver 1300 may further include one or more gate driver integrated circuits. Each gate driver integrated circuit is connected to a bonding pad of the display panel 1100 by a tape automatic bonding (TAB) method or a chip on glass (COG) method or implemented by a gate in panel (GIP) type to be directly disposed on the display panel 1100, and in some cases, may be integrated and disposed on the display panel 1100. Further, each gate driver integrated circuit may be implemented by a chip on film (COF) method. In this case, a gate driving chip corresponding to each gate driver integrated circuit is mounted on a flexible film and one end of the flexible film is bonded to the display panel 1100.

The data driver 1200 converts the image data received from the timing controller 1400 into analog-type data voltages when a specific gate line is selected to supply the converted data voltages to the plurality of data lines, and thus, drives the plurality of data lines DL1 to DLm. In addition, the data driver 1200 may include at least one source driver integrated circuit to drive the plurality of data lines DL1 to DLm.

Each source driver integrated circuit is connected to a bonding pad of the display panel 1100 by a tape automatic bonding (TAB) method or a chip on glass (COG) method or to be directly disposed on the display panel 1100, and in some cases, may be integrated and disposed on the display panel 1100. Further, each source driver integrated circuit may be implemented by a chip on film (COF) method. In this case, a source driving chip corresponding to each source driver integrated circuit is mounted on a flexible film, one end of the flexible film is bonded to at least one source printed circuit board, and the other end is bonded to the display panel 1100.

The source printed circuit board is connected with a control printed circuit board through a connection medium such as a flexible flat cable (FFC) or a flexible printed circuit (FPC). The timing controller 1400 is disposed in the control printed circuit board.

In the control printed circuit board, a power controller (not illustrated) which supplies voltage or current to the display panel 1100, the data driver 1200, the gate driver 1300, and the like, or controls the voltage or the current to be supplied may be further disposed. The source printed circuit board and the control printed circuit board which are described above may form one printed circuit board.

Meanwhile, a pixel includes one or more subpixels. The subpixel means a unit in which a specific color of color filter is formed, or an organic emission element emits light having a specific color. The color defined in the subpixel may include red R, green G, blue B, and selectively white W, but the present disclosure is not limited thereto.

Also, an electrode which is connected to a thin film transistor for controlling light emission in each subpixel area of the display panel is called a first electrode, and an electrode which is disposed on an entire surface of the display panel or on two or more pixel areas is called a second electrode. When the first electrode is an anode electrode, the second electrode is a cathode electrode, and vice versa. Hereinafter, exemplary embodiments in which the anode electrode is the first electrode and the cathode electrode is the second electrode will be mainly described, but the present disclosure is not limited thereto.

Further, in the aforementioned subpixel area, a color filter having a single color may be disposed. The color filter converts a single color of the organic light emission layer into a color having a predetermined wavelength. Further, a light-scattering layer may be disposed in each subpixel area in order to enhance light extraction efficiency of the organic light emission layer. The light-scattering layer may be referred to as a micro lens array, a nano pattern, a diffuse pattern, and a silica bead. Hereinafter, examples of a light-scattering layer or a micro lens array will be mainly described, but the present disclosure is not limited thereto. Various structures for scattering light may be employed.

Figure 2:
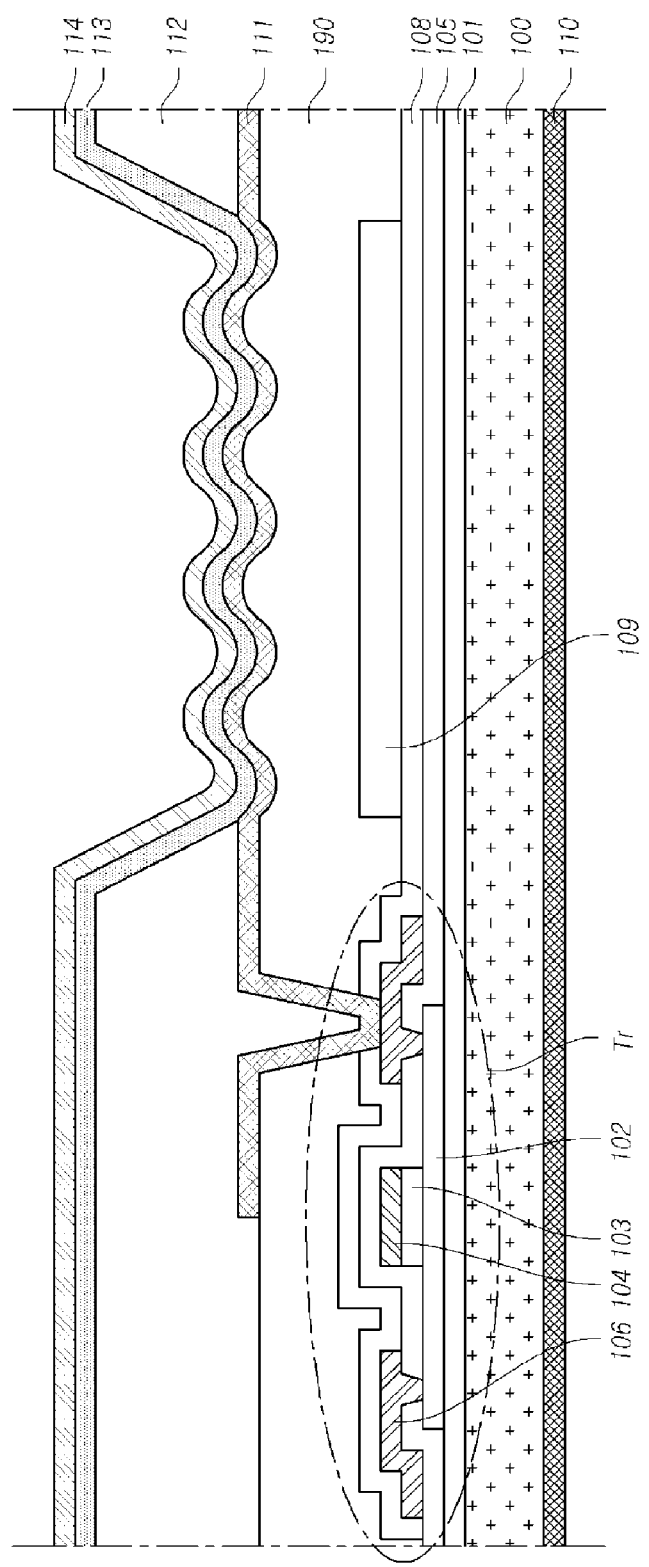
FIG. 2 is a cross-sectional view of a bottom-emission type organic light emitting diode display device to which exemplary embodiments of the present disclosure are applied.

FIG. 2 is a cross-sectional view of a bottom-emission type organic light emitting diode display device to which exemplary embodiments of the present disclosure are applied.

Referring to FIG. 2, the bottom-emission type organic light emitting diode display device includes a thin film transistor Tr including an active layer 102, a gate electrode 104, a source electrode 106, and a drain electrode 107 and an organic emission element which is electrically connected with the thin film transistor Tr and includes a first electrode 111, an organic emission layer 113, and a second electrode 114.

In detail, a buffer layer 101 is disposed on the substrate 100. The active layer 102 of the thin film transistor Tr is disposed on the buffer layer 101. A gate insulating layer 103 and the gate electrode 104 are disposed on the active layer 102. An interlayer insulating layer 105 is disposed on the gate electrode 104.

In addition, a source electrode 106 and a drain electrode 107 which contact the active layer 102 are disposed on the interlayer insulating layer 105 through a contact hole formed in the interlayer insulating layer 105. A protective layer 108 is disposed on the source electrode 106 and the drain electrode 107. A color filter layer 109 may be disposed on one surface of the protective layer 108.

An overcoating layer 190 is disposed on the substrate 100 including the color filter layer 109. The first electrode 111 of the organic emission element which is connected with the drain electrode 107 of the thin film transistor Tr is disposed on the overcoating layer 190. In addition, a bank pattern 112 is disposed on the overcoating layer 109 to expose a part of the upper surface of the first electrode 111. Herein, the bank pattern 112 defines an emission area and a non-emission area of the organic light emitting diode display device. An organic emission layer 113 is disposed on the upper surface of the first electrode 111 exposed by the bank pattern 112. The second electrode 114 of the organic emission element is disposed on the organic emission layer 113.

The first electrode 111 may be made of a transparent conductive material and the second electrode 114 may be made of an opaque conductive material with excellent reflectivity to implement a bottom-emission type organic light emitting diode display device.

Further, a polarizing plate 110 is disposed on a rear surface of the substrate 100. The polarizing plate 110 may be a polarizing plate 110 having a polarization axis in a predetermined direction and transmit the light having the same directional axis as the polarization axis of the light incident from the rear surface of the substrate 100. In FIG. 2, the polarizing plate 110 of a single layer is illustrated, but the present disclosure is not limited thereto, and the polarizing plate 110 may have a multi-layered structure.

In FIG. 2, the overcoating layer including a plurality of recesses or protrusions is introduced in order to enhance light extraction effect, but the light extraction efficiencies may be different between the recesses and the protrusions of the overcoating layer; thus, the reflectivity may increase and a light leakage phenomenon may occur.

Hereinafter, exemplary embodiments of the present disclosure are described in which a reflective pattern is disposed to overlap the overcoating layer to enhance light emission efficiency and reduce reflectivity and light leakage phenomenon of the organic light emitting diode display device.

Figure 3:
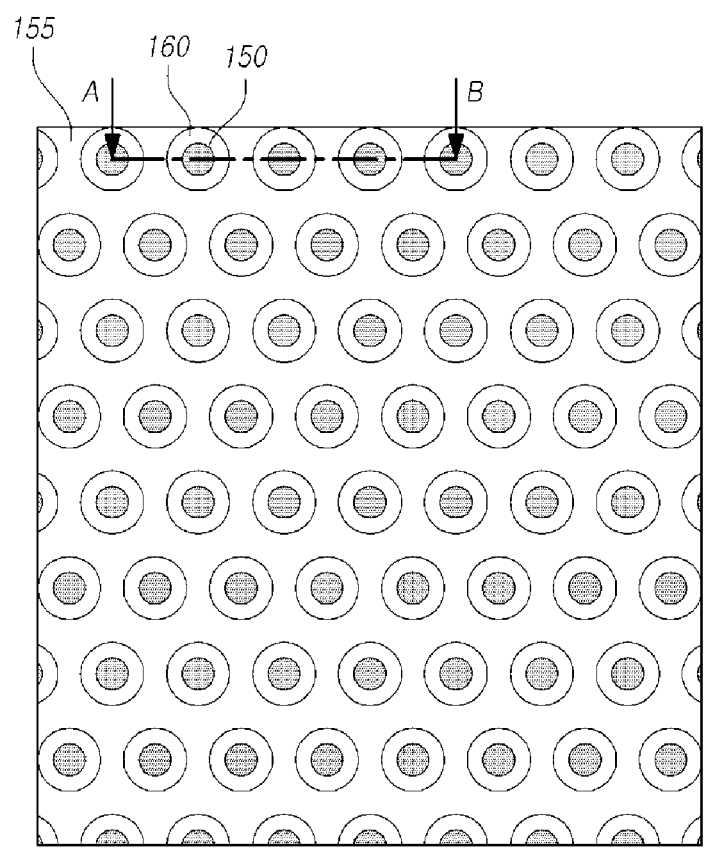
FIG. 3 is a plan view illustrating an area where a micro lens is disposed in a display device according to an exemplary embodiment of the present disclosure.

FIG. 3 is a plan view illustrating an area where a micro lens is disposed in a display device according to an exemplary embodiment of the present disclosure.

Referring to FIG. 3, in the display device according to the exemplary embodiment of the present disclosure, an area where a micro lens is disposed is divided into a first area 150, a second area 160, and a third area 155.

The first area 150 may be an area corresponding to a partial area of the recess of the micro lens, the second area 160 may be an area corresponding to an area where a wall surrounding the recess is disposed, and the third area 155 may be an area corresponding to a partial area of the protrusion of the micro lens. Herein, in the first area 150 and the third area 155, a thickness of the organic emission layer of the organic emission element may be greater than that of the second area 160. That is, the first area 150, the second area 160, and the third area 155 may be divided according to their thicknesses of the organic emission layer disposed on the micro lens. In this case, in the first area 150, a reflective pattern may be disposed to overlap the micro lens.

In FIG. 3, an area where the micro lens is disposed is illustrated as a circle, but the present disclosure is not limited thereto and the micro lens may have various configurations and shapes such as a hexagon and an oval.

Figure 4:
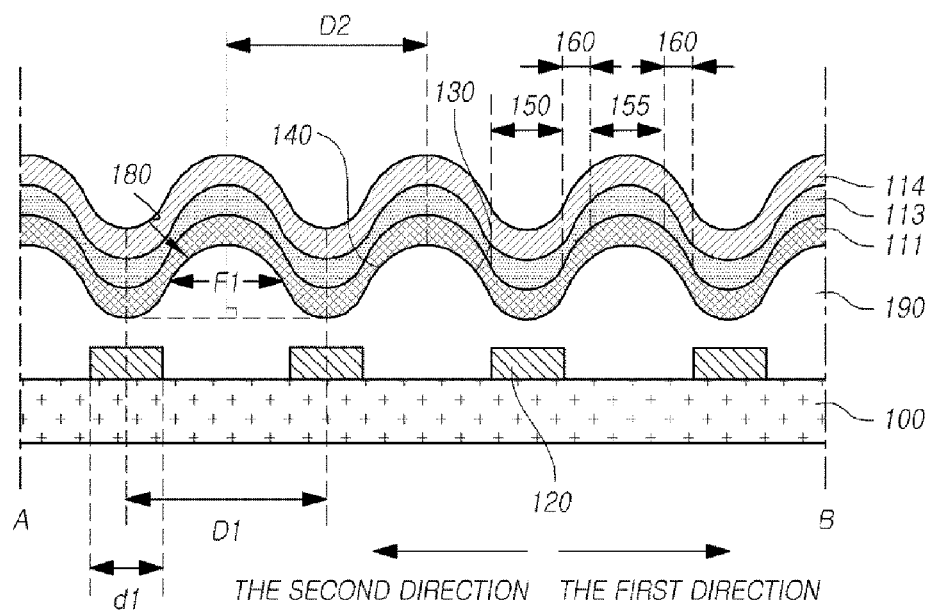
FIG. 4 is a cross-sectional view taken along line A-B in FIG. 3.

FIG. 4 is a cross-sectional view taken along line A-B in FIG. 3. First, when schematically describing a displacement relationship between the overcoating layer 190 and the reflective pattern according to the exemplary embodiment of the present disclosure with reference to FIG. 4, the reflective pattern 120 and the overcoating layer 190 are disposed on the substrate 100. The overcoating layer 190 has a non-flat surface opposite to the substrate 100, and the reflective pattern 120 is disposed between the non-flat surface and the substrate 100.

Referring to FIG. 4, the overcoating layer 190 includes a plurality of micro lenses 180 located on a non-flat surface. The micro lenses 180 may have a shape in which a plurality of recesses and protrusions are alternately disposed. Further, the micro lenses 180 include a plurality of first areas 150 which are areas corresponding to a partial area of the recesses.

Herein, the reflective pattern 120 may be disposed in an area corresponding to the first area 150 of the micro lens 180. Particularly, a thin film transistor and a color filter layer may be disposed on the substrate 100, an insulating layer may be disposed on the thin film transistor and the color filter layer, and the reflective pattern 120 may be disposed on the insulating layer. As a result, the light generated from the organic emission element may be reflected by the reflective pattern 120 to be emitted to the outside of the substrate 100.

Hereinafter, a light path and an effect thereof will be described in detail with reference to FIGS. 9 to 11.

Meanwhile, in the area with the plurality of micro lenses corresponding to the emission area, a primary emission phenomenon is caused by the organic emission element in the area corresponding to the second area 160 and the third area 155 of the micro lens. Particularly, in the area corresponding to the second area 160, an incident angle of light incident on an inclined surface of the micro lens (emitted from the organic emission element) is mainly gathered within a total reflection threshold angle (approximately 42°) to enable multiple reflections, thereby enhancing light extraction efficiency. Further, in the second area 160, the thickness of the organic emission layer 113 is the smallest and thus, current density is high, and the light emission efficiency of the organic emission element in the second area 160 may be enhanced. In the third area 155 of the micro lens, the thickness of the organic emission layer 113 is greater than the inclined surface of the micro lens and thus, the current density is low, but the light extraction efficiency caused by the micro lens is very high.

As such, in the area corresponding to the second area 160 and the third area 155 of the micro lens where the primary emission phenomenon occurs, the reflective pattern 120 according to the exemplary embodiment may not be disposed. That is, the reflective pattern 120 according to the exemplary embodiment may be disposed in the area corresponding to the first area 150 of the micro lens where the emission phenomenon occurs less.

As a result, the light directed at an angle of a threshold angle or emitted from the area where the primary emission phenomenon occurs is subjected to an additional reflection by the reflective pattern 120, thereby increasing an amount of the light extracted to the outside of the substrate 100. In other words, in the area corresponding to the first area 150 of the micro lens where the primary emission phenomenon occurs less, the reflective pattern 120 is disposed to improve light efficiency through the additional reflection.

Meanwhile, a width d1 of the reflective pattern 120 may be smaller than a distance D1 between two centers of the adjacent two recesses of the micro lenses 180. The width d1 of the reflective pattern 120 is smaller than the distance D1, thereby improving the light extraction effect through the micro lens 180. In detail, when the width d1 of the reflective pattern 120 is greater than the distance D1, the path of the light extracted to the outside of the substrate 100 from the micro lens 180 is changed, and thus, the light may be blocked in the device and not be extracted to the outside of the substrate 100. That is, when the width d1 of the reflective pattern 120 is greater than the distance D1, an amount of the light blocked in the device increases and light extraction efficiency may be reduced.

In one embodiment of the present disclosure, each of the protrusions of the micro lenses 180 can include two convex portions located on opposite two sides of the recess. A width (d1) of the reflective pattern 120 is smaller than a distance (D2) between two centers of the two convex portions.

Meanwhile, the reflective pattern 120 may be made of a metal material. For example, the reflective pattern 120 may be made of metal such as silver (Ag), copper (Cu), gold (Au), tin (Sn), and aluminum (Al), but the reflective pattern 120 according to the exemplary embodiment is not limited thereto. The reflective pattern 120 is beneficially made of metal having a high reflectivity.

The micro lens 180 includes slopes 130 and 140, and each of the slopes 130 and 140 can be a wall surrounding the recess. In this case, a first slope 130 and a second slope 140 extended in a first direction may configure the protrusion of the micro lens 180. The overcoating layer 190 includes the micro lens 180 described above to extract the light blocked in the organic light emitting diode display device to the outside of the substrate 100, thereby improving light efficiency.

An angle between the inclination of the slopes 130 and 140 surrounding the micro lens and a horizontal surface of the recess may be 40° to 60° or 120° to 140°.

Accordingly, the light extraction efficiency of the micro lens may be enhanced. Particularly, multiple reflection of the light generated from the organic emission element may occur due to the inclination of the slopes 130 and 140 surrounding the recess of the micro lens, thereby increasing the amount of light emitted to the outside.

Figure 5:
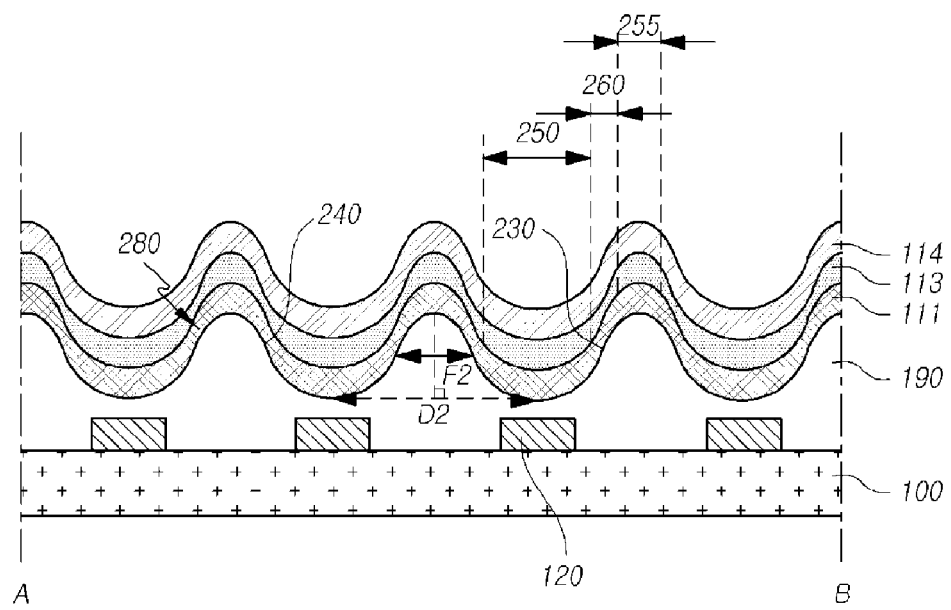
FIG. 5 is a diagram illustrating a micro lens and a reflective pattern according to another exemplary embodiment of the present disclosure.
Figure 6:
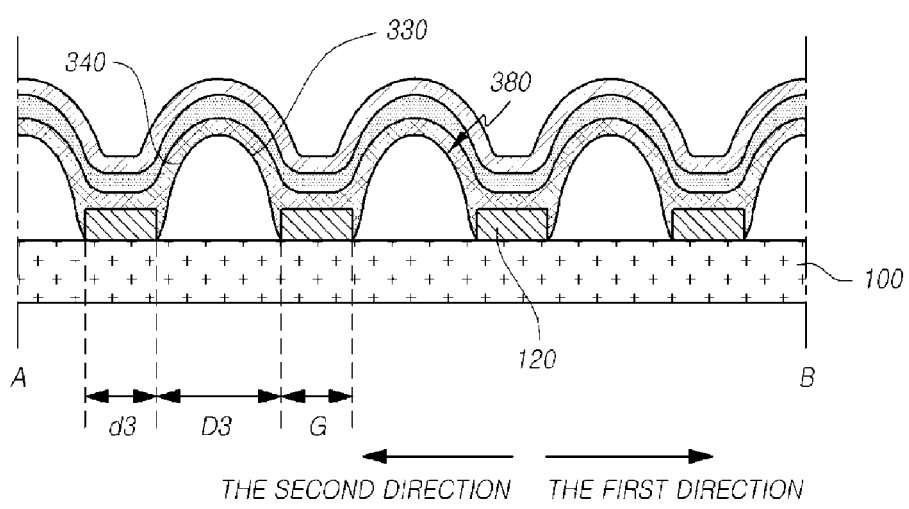
FIG. 6 is a diagram illustrating a micro lens and a reflective pattern according to yet another exemplary embodiment of the present disclosure.

Further, the shape of the micro lens 180 is not limited to the configuration illustrated in FIG. 4, and may have various shapes including the shapes illustrated in FIGS. 5 and 6. FIG. 5 is a diagram illustrating a micro lens and a reflective pattern according to another exemplary embodiment of the present disclosure. FIG. 6 is a diagram illustrating a micro lens and a reflective pattern according to yet another exemplary embodiment of the present disclosure.

The exemplary embodiments illustrated in FIGS. 5 and 6 may include the same constituent elements as the exemplary embodiment described above. Thus, the duplicative description thereof may be omitted. Further, like constituted elements have like reference numerals.

As compared to the FWHM F1 of the micro lens 180 illustrated in FIG. 4, a full width at half maximum (FWHM) F2 of a micro lens 280 illustrated in FIG. 5 is smaller. Herein, a FWHM of a micro lens may be defined by a width of a concave portion of the micro lens at the location of the half height of the micro lens. The FWHM of the micro lens may be determined according to an amount of exposure to be irradiated onto an overcoating layer material in the process of forming the micro lens, a material of the overcoating layer, and the like.

Further, the micro lens 280 according to another exemplary embodiment may include a recess and slopes 230 and 240 surrounding the recess. Further, the inclination of the slopes 230 and 240 surrounding the recess may form an angle of 40° to 60° or 120° to 140° with a horizontal surface.

However, the FWHM F1 of the micro lens 180 illustrated in FIG. 4 is larger than the FWHM F2 of the micro lens 280 illustrated in FIG. 5, and thus the inclination of the slopes 130 and 140 surrounding the recess of the micro lens 180 of FIG. 4 may be smaller than the inclination of the slopes 230 and 240 surrounding the recess of the micro lens 280 of FIG.

5. As such, the shape of the micro lens according to the exemplary embodiment of the present disclosure may be freely adjusted by controlling a condition including an amount of exposure, the material of the overcoating layer, and the like, and as a result, a desired light extraction effect can be expected.

Further, even the reflective pattern 120 in FIG. 5 may be disposed in an area corresponding to the first area 250 of the micro lens 280. A width d2 of the reflective pattern 120 may be smaller than the distance D2 between the two centers of the adjacent two recesses of the micro lenses 280.

In FIG. 6, micro lenses 380 may be spaced apart from each other on the substrate 100 on a cross section. In this case, the micro lens 380 may be constituted by a recess and walls 330 and 340 surrounding the recess. In this case, the inclination of the walls 330 and 340 surrounding the recess of micro lens may form an angle of 40° to 60° or 120° to 140° with a horizontal surface.

In FIG. 6, the micro lens 380 and another micro lens adjacent to the micro lens 380 may be spaced apart from each other. Accordingly, a separation space may be formed between the micro lens 380 and another micro lens adjacent to the micro lens 380.

In one embodiment of the present disclosure, the overcoating layer has one or plural openings, as illustrated in FIG. 6. Each of the protrusions of the micro lenses 380 includes two convex portions spaced apart from each other by the opening. The reflective pattern 120 is disposed in the separation space corresponding to the opening, and the separation space corresponds to the recess of the micro lens 380.

The micro lens 380 may be formed on the overcoating layer through a mask process. Whether the separation space between the micro lenses 380 is formed or not and a width of the separation space may be determined according to a separation distance of mask patterns and an amount of exposure during the mask process.

In detail, micro lens 380 patterns for forming the micro lens 380 on the overcoating layer may be disposed on the mask to be spaced apart from each other. When the separation distance between the micro lens 380 patterns disposed on the mask is large, the separation distance between the micro lenses 380 formed on the overcoating layer is large, and as the exposure amount increases during the mask process, the separation distance between the micro lenses 380 may also increase.

In this case, the separation space between the micro lens 380 and another micro lens 380 adjacent to the micro lens 380 may be formed to be smaller than a distance D3 of the adjacent two recesses of the micro lenses 380. Accordingly, the light extraction effect through the micro lens 380 may be enhanced.

Meanwhile, in an area corresponding to the separation space formed between the micro lenses 380, the reflective pattern 120 may be disposed. The reflective pattern 120 is disposed in the separation space between the micro lenses 380, and thus even in the case where a color filter layer (not illustrated) is exposed by the separation space, the reflective pattern 120 is disposed on the exposed color filter layer (not illustrated) to reduce or prevent the color filter layer (not illustrated) from being exposed. Accordingly, outgassing by the color filter layer (not illustrated) may be reduced or prevented.

Herein, a width d3 of the reflective pattern 120 may be smaller than a distance D3 of the protrusion of the micro lens 380. Accordingly, the light extraction effect of the reflective pattern 120 may be enhanced.

Figure 7:
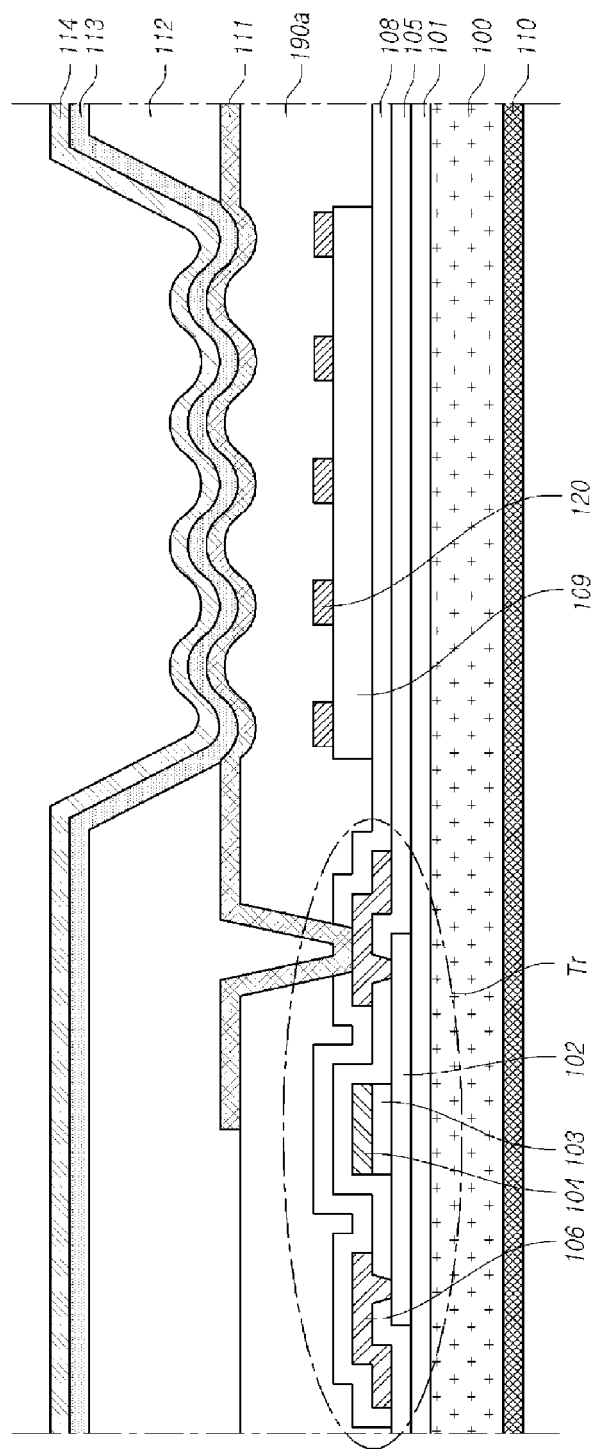
FIG. 7 is a cross-sectional view illustrating an organic light emitting diode display device according to an exemplary embodiment of the present disclosure.

In the organic light emitting diode display device according to an embodiment of the present disclosure, micro patterns may have various shapes. A cross-sectional view of the organic light emitting diode display device to which the plurality of micro lenses and the plurality of reflective patterns are applied as described above will now be described in detail. FIG. 7 is a cross-sectional view illustrating an organic light emitting diode display device according to an exemplary embodiment of the present disclosure.

Referring to FIG. 7, a plurality of micro lenses 180 are formed on the overcoating layer 190. In this case, the plurality of micro lenses 180 may be formed to overlap a color filter layer 109 disposed on the protective layer 108. Further, the plurality of micro lenses 180 may be disposed at a location corresponding to the emission area and the non-emission area defined by the bank pattern 112. As such, the plurality of micro lenses 180 are disposed in the area corresponding to the emission area to extract the light emitted from the organic emission element to the outside of the substrate 100. That is, the plurality of micro lenses 180 are beneficially disposed only in the area for light extraction. Accordingly, the light extraction efficiency may be enhanced. In addition, the plurality of reflective patterns 120 may be disposed on the color filter layer 108 so as to correspond to the recess.

A first electrode 111 of an organic emission element EL which is connected with the drain electrode 107 of the thin film transistor Tr is disposed on the overcoating layer 190. Herein, the first electrode 111 may be formed according to a morphology of the overcoating layer 110. That is, in the first electrode 111, recesses and protrusions may be alternately disposed in an area corresponding to the area where the micro lens 180 is formed on the overcoating layer 190.

Further, even in the organic emission layer 113 and the second electrode 114 of the organic emission element EL disposed on the first electrode 111, recesses and protrusions may be alternately disposed in an area corresponding to the area where the micro lens 180 is formed on the overcoating layer 190. That is, the reflective pattern 120 may be disposed in an area corresponding to the recesses of the first electrode 111, the organic emission layer 113, and the second electrode 114 of the organic emission element EL. The reflective pattern 120 may be disposed in an area corresponding to the recess of the plurality of micro lenses 180 in the emission area (the area without the bank pattern).

FIG. 7 illustrates an organic light emitting diode display device applying the micro lens 1480 according to the exemplary embodiment of the present disclosure, but the present disclosure is not limited thereto and other types of micro lenses according to the other exemplary embodiments as described above may be applied.

Figure 8:
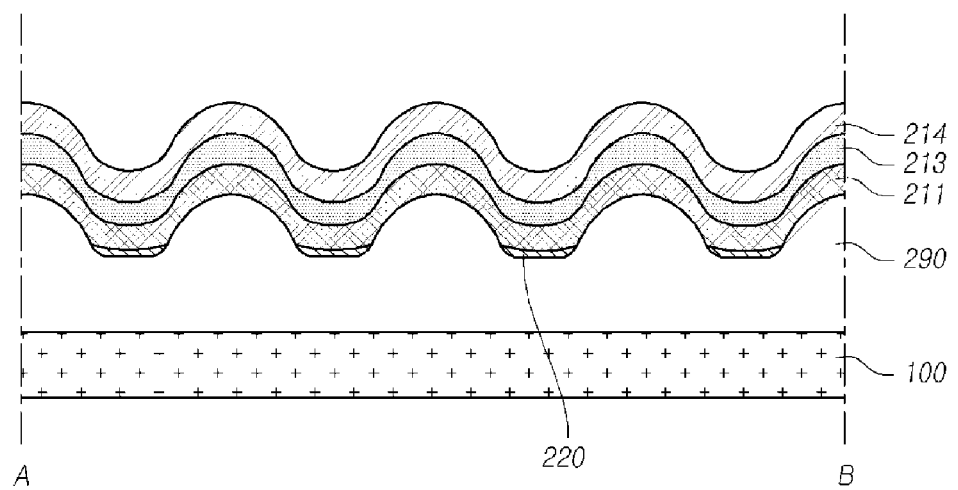
FIG. 8 is a diagram illustrating a position of a reflective pattern according to another exemplary embodiment of the present disclosure.

A location of a reflective pattern according to another exemplary embodiment of the present disclosure will now be described below with reference to FIG. 8. FIG. 8 is a diagram illustrating a location of a reflective pattern according to another exemplary embodiment of the present disclosure. FIG. 8 may include the same constituent elements as the exemplary embodiments described above. Thus, the duplicative description thereof may be omitted. Further, similar constituted elements have similar reference numerals.

Referring to FIG. 8, a reflective pattern 220 according to another exemplary embodiment of the present disclosure may be disposed between an overcoating layer 290 and a first electrode 211 in an area corresponding to a recess of the overcoating layer 290. That is, the reflective pattern 220 is disposed on the overcoating layer 290 in the area corresponding to the recess of the overcoating layer 290 and may be disposed below the first electrode 211.

As described above, when the reflective pattern 220 is positioned, the overcoating layer 290 with the plurality of micro lenses is formed. Thereafter, a metal layer is formed on the overcoating layer 290 and a photoresist is formed on the metal layer. In addition, the reflective pattern 220 is formed in the area corresponding to the recess of the overcoating layer 290 by wet-etching the metal layer.

As such, the reflective pattern 220 is disposed on the overcoating layer 290 to reduce or prevent the plurality of micro lenses from being irregularly formed due to moisture, impurities, and the like which may be generated in the process of forming the reflective pattern 220. In detail, the reflective pattern 220 according to the exemplary embodiment is formed after the overcoating layer 290 including the plurality of micro lenses is formed to reduce or prevent the micro lenses from being irregularly formed due to impurities generated in the process of forming the reflective pattern 220.

Meanwhile, the recess of the overcoating layer 290 may be flatly formed as compared with the recess of the overcoating layer 190 illustrated in FIG. 4, but the exemplary embodiment is not limited thereto. Further, the first electrode 211, the organic emission layer 213, and the second electrode 214 which are formed on the reflective pattern 240 may be formed flatly as compared with the first electrode 111, the organic emission layer 113, and the second electrode 114 illustrated in FIG. 4 in the area corresponding to the recess of the overcoating layer 290 by the reflective pattern 220, but the exemplary embodiment is not limited thereto.

An organic light emitting diode display device according to an embodiment of the present disclosure may have effects of reducing reflectivity, reducing or preventing light leakage, and enhancing the light extraction efficiency. This will now be described with reference to FIGS. 9 to 11.

Figure 9:
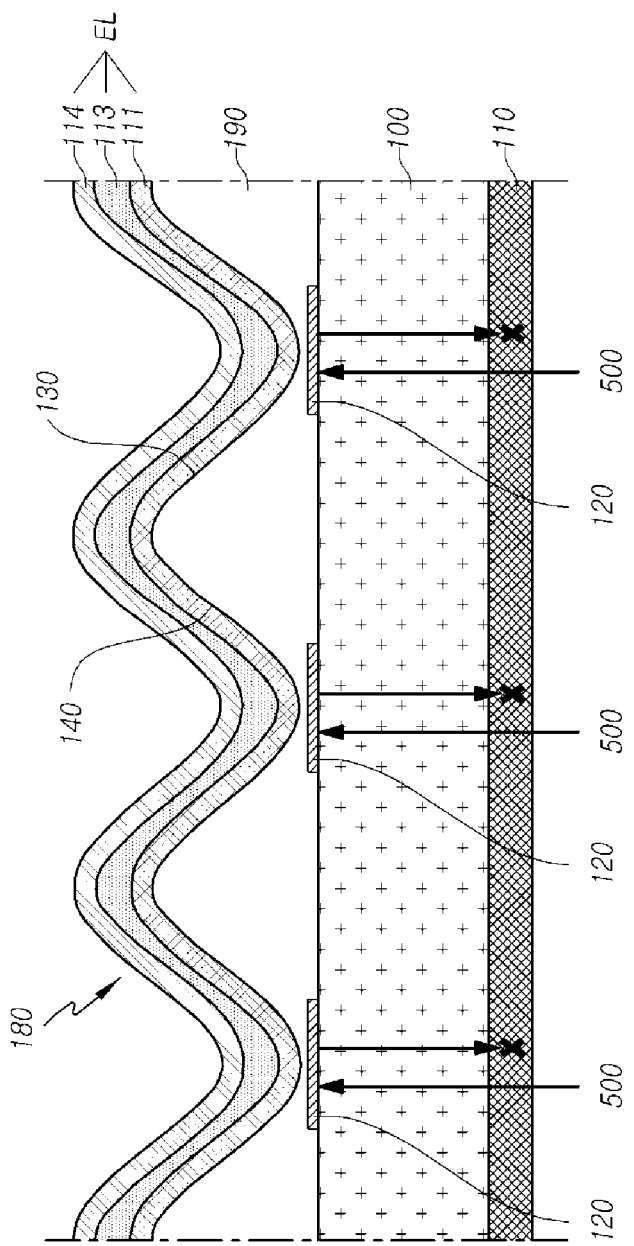
FIG. 9 is a diagram illustrating a principle of reducing reflectivity in an organic light emitting diode display device according to an exemplary embodiment of the present disclosure.

FIG. 9 is a diagram illustrating a principle of reducing reflectivity in an organic light emitting diode display device according to an exemplary embodiment of the present disclosure. For convenience of description, a configuration in which the reflective pattern 120 is disposed below an overcoating layer 190 will be mainly described. However, a configuration in which a reflective pattern 120 is disposed on the overcoating layer 190 may also reduce reflectivity.

Referring to FIG. 9, the overcoating layer 190 including a plurality of reflective patterns 120 and a plurality of micro lenses 180 according to the exemplary embodiment of the present disclosure is disposed on the substrate 100. Further, a polarizing plate 110 is disposed on the substrate 100. The polarizing plate 110 may be disposed by overlapping a polarizing plate having a polarization axis in a predetermined direction and having a predetermined retardation value.

Herein, while an external light 500 incident on a rear surface of the substrate 100 passes through the polarizing plate 110, the light in the same direction as the polarization axis of the polarizing plate 110 is transmitted. In addition, the light polarized in the predetermined direction is circularly polarized due to the predetermined retardation value to be transmitted into the substrate 100. The light transmitted into the substrate 100 is reflected by the second electrode 114 of the organic emission element EL to be retarded at 180° from the light passing through the polarizing plate 110. The path of the retarded light may be changed in the substrate 100 direction again.

Meanwhile, the overcoating layer 190 includes the plurality of micro lenses 180 and thus the first electrode 111, the organic emission layer 113, and the second electrode 114 of the organic emission element EL also have a shape in which the recesses and the protrusions are alternately disposed. Herein, the second electrode 114 reflects the light incident from the substrate 100, and in this case, a part of the reflected light is shifted in an opposite direction with respect to the polarization axis of the polarizing plate 110.

However, the second electrode 114 is not flatly formed, and thus the remaining part of the light incident from the substrate 100 is reflected in the same state as the polarization axis of the polarizing plate 110. As a result, the reflectivity of the organic light emitting diode display device may be enhanced.

Meanwhile, in the exemplary embodiment of the present disclosure, the reflective pattern 120 is disposed in the area corresponding to the recess of the micro lens 180 formed on the overcoating layer 190. The reflective pattern 120 may be disposed on an insulating layer disposed on the thin film transistor and a color filter layer disposed on the substrate 100. In this case, the light in the same direction as the polarization axis of the polarizing plate 110 is incident to be circularly polarized due to a predetermined retardation value and the circularly polarized light is then incident on the substrate 100. The light incident on the substrate 100 is reflected by the reflective pattern 120 and the path of the light reflected by the reflective pattern 120 is changed in the substrate 100 direction.

The light of which the path is changed in the substrate 100 direction passes through the polarizing plate having the predetermined retardation value to reach the polarizing plate having the predetermined polarization axis. However, while the light of which the path is changed in the substrate 100 direction passes through the polarizing plate having the predetermined retardation value, the polarization direction may be shifted in an opposite direction with respect to the polarization axis of the polarizing plate having the predetermined polarization axis.

Accordingly, the light reflected by the reflective pattern 120 may not be emitted to the outside of the substrate 100. That is, the reflectivity by the external light 500 may be decreased in the area where the reflective pattern 120 is disposed. In other words, in the exemplary embodiment of the present disclosure, the reflective pattern 120 is disposed in the area corresponding to the recess of the micro lens 180 to reduce or prevent the reflection of the external light 500 in the area with the reflective pattern 120. As a result, the display device according to the exemplary embodiment of the present disclosure may reduce the reflectivity of the external light 500 in proportion to the area having the reflective pattern 120.

Next, a principle of suppressing a light leakage phenomenon in the organic light emitting diode display device according to the exemplary embodiment of the present disclosure will now be described below with reference to FIG. 10. For convenience of description, a configuration in which the reflective pattern 120 is disposed below the overcoating layer 190 will be mainly described. Even in a configuration in which the reflective pattern 120 is disposed on the overcoating layer 190, a light leakage may be suppressed. FIG. 10 is a diagram illustrating a principle of suppressing a light leakage phenomenon in an organic light emitting diode display device according to an exemplary embodiment of the present disclosure.

Figure 10:
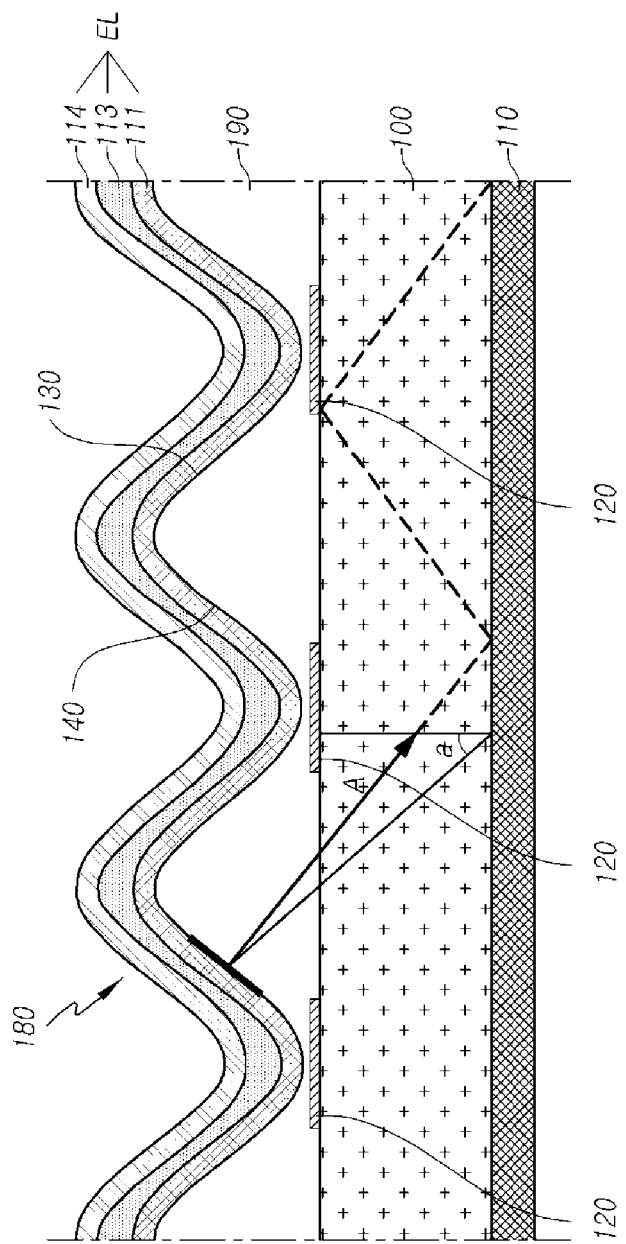
FIG. 10 is a diagram illustrating a principle of suppressing a light leakage phenomenon in an organic light emitting diode display device according to an exemplary embodiment of the present disclosure.

Referring to FIG. 10, a plurality of reflective patterns 120 and the overcoating layer 190 including a plurality of micro lenses 180, and the organic emission element EL according to the exemplary embodiment of the present disclosure are disposed on the substrate 100. In this case, refractive indices of the first electrode 111 and the organic emission layer 113 of the organic emission element EL may be greater than refractive indices of the substrate 100 and the overcoating layer 190. For example, the refractive indices of the substrate 100 and the overcoating layer 190 may be approximately 1.5 and the refractive indices of the first electrode 111 and the organic emission layer 113 of the organic emission element EL may be 1.7 to 2.0.

In this case, a part of the light emitted from the organic emission layer 113 is reflected by the second electrode 114 and thus the light path is shifted in the first electrode 111 direction, and the remaining part is emitted in the first electrode 111 direction. That is, most of the light generated by the organic emission layer 113 is directed in the first electrode 111 direction.

Herein, since the reflective indices of the organic emission layer 113 and the first electrode 111 are almost the same as each other, the path of the light generated from the organic emission layer 113 may not be changed at an interface between the organic emission layer 113 and the first electrode 111. Meanwhile, in the light passing through the first electrode 111, the light incident at a threshold angle or more may be totally reflected at the interface between the first electrode 111 and the overcoating layer 190 due to a difference in refractive index between the first electrode 111 and the overcoating layer 190.

In this case, the light which is totally reflected at the interface between the first electrode 111 and the overcoating layer 190 passes through the substrate 100 having almost the same refractive index as the overcoating layer 190 to reach the polarizing plate 110 and is reflected in the polarizing plate 110 again and then the path is shifted in the substrate 100 direction. Herein, a part of the light directed in the substrate 100 direction reaches the micro lens of adjacent pixels emitting different color of light to cause a light leakage phenomenon.

Meanwhile, in the exemplary embodiment of the present disclosure, the reflective pattern 120 is disposed in the area corresponding to the recess of the micro lens 180 formed on the overcoating layer 190 to reduce or prevent the light directed at an angle greater than a total reflection threshold angle a from reaching the micro lens 180 of another adjacent pixel.

In detail, a total reflection of the light generated from the organic emission layer 113 may occur at the interface between the first electrode 111 and the overcoating layer 190. Herein, the light directed at the angle greater than a total reflection threshold angle 'a' is reflected again at the interface between the substrate 100 and the polarizing plate 110 by passing through the overcoating layer 190 and the substrate 100 and then the light path is shifted in the substrate 100 direction.

Thereafter, the light of which the path is changed in the substrate 100 direction passes through the substrate 100 again to reach the reflective pattern 120 disposed on the substrate 100. The light reaching the reflective pattern 120 is reflected by the reflective pattern 120 and the path is shifted in the polarizing plate 110 direction again, and the light reaching the polarizing plate 110 passes through the substrate 100 again to reach the reflective pattern 120. That is, the light directed at an angle greater than the total reflection threshold angle 'a' reaches the polarizing plate 110 and then reaches the reflective pattern 120 at least once to be blocked in the substrate 100. Accordingly, the light directed at an angle greater than the total reflection threshold angle 'a' is present in the blocked state in the substrate 100.

As such, in the organic light emitting diode display device according to the exemplary embodiment of the present disclosure, even in the case where the light directed at an angle greater than the total reflection threshold angle 'a' is generated, the light may not reach the micro lens 180 of another pixel by the reflective pattern 120 to reduce or prevent a light leakage phenomenon.

Next, a principle of improving light extraction efficiency in an organic light emitting diode display device according to an exemplary embodiment of the present disclosure will now be described with reference to FIG. 11. FIG. 11 is a diagram illustrating a principle of improving light extraction efficiency in the organic light emitting diode display device according to the exemplary embodiment of the present disclosure. For convenience of description, a configuration in which the reflective pattern 120 is disposed below the overcoating layer 190 will be mainly described. Even in a configuration in which the reflective pattern 120 is disposed on the overcoating layer 190, light extraction efficiency may be improved.

Figure 11:
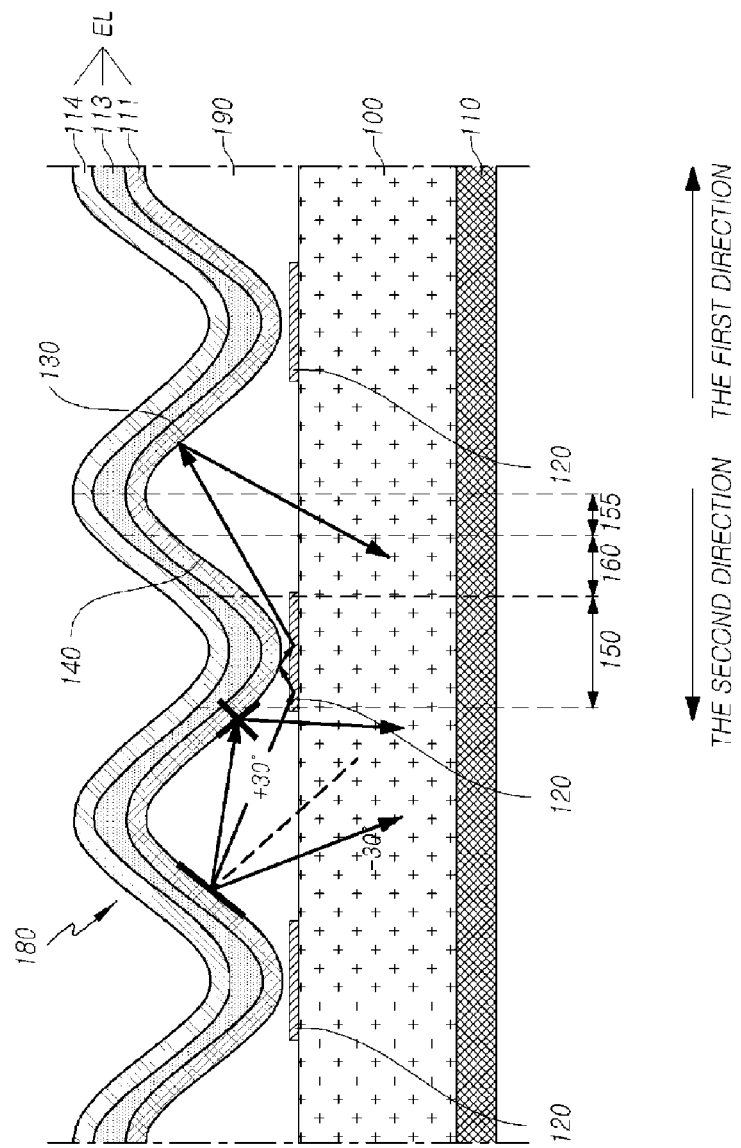
FIG. 11 is a diagram illustrating a principle of improving light extraction efficiency in an organic light emitting diode display device according to an exemplary embodiment of the present disclosure.

Referring to FIG. 11, a plurality of reflective patterns 120 and the overcoating layer 190 including a plurality of micro lenses 180, and the organic emission element EL according to the exemplary embodiment of the present disclosure are disposed on the substrate 100.

The micro lenses 180 are divided into the first area 150, the second area 160, and the third area 155 and the light extraction efficiency is most excellent in the second area 160. Particularly, a thickness of the organic emission layer 113 which follows a morphology of the overcoating layer 190 is formed to be smallest and thus the current density of the second area 160 is high. As a result, an electric filed is strongly applied to the second area 160, and thus primary emission is caused in the organic emission element disposed in the area corresponding to the second area 160.

Further, due to the slope formed in the second area 160 of the micro lens 180, the light extraction efficiency of the light generated from the organic emission element is the highest in the second area 160. For example, when the micro lens 180 is constituted by a recess, a first slope 130 surrounding the recess, and a second slope 140 extended from the first slope 130 along the first direction, the light generated from the organic emission element is incident on the first slope 130 of the second area 160 of the micro lens 180 to be crashed into the first slope 130 or the second slope 140, and thus an amount of light extracted to the outside of the substrate 100 is increased. In other words, the light generated from the organic emission element EL is incident on the second slope 140 of the micro lens 180, and the light directed at an angle of −30° to −90° or 30° to 90° based on a line vertical to a tangent line of the second slope 140 is crashed into the second slope 140 and the first slope 130 extended in the first direction to be extracted to the outside of the substrate 100.

Further, the light directed at an angle of −30° to 30° based on the line vertical to the tangent line of the second slope 140 may not reach the second slope 140 and the first slope 130 extended in the first direction and thus may not be extracted to the outside of the substrate 100 to be blocked in the element.

Meanwhile, in the organic light emitting diode display device according to the exemplary embodiment of the present disclosure, the reflective pattern 120 is disposed in the area corresponding to the recess of the micro lens 180 formed on the overcoating layer 190, thereby further enhancing light extraction efficiency.

In detail, based on a line vertical to a straight line representing the inclination of the second slope 140 in the light generated from organic emission element EL, the light directed at an angle of −30° to 30° reaches the reflective pattern 120 disposed in the area corresponding to the recess of the micro lens 180. The light reaching the reflective pattern 120 reaches another micro lens 180 adjacent to the micro lens 180 to which the light generated from the organic emission element EL is incident on be extracted to the outside of the substrate 100. As such, the light incident at an angle of −30° to 30° based on the line vertical to the tangent line of the second slope 140 reaches the reflective pattern 120 at least once. As a result, based on the line vertical to the tangent line of the second slope 140, the light is shifted into the light directed at an angle of −30° to −90° or 30° to 90° to be extracted to the outside of the substrate 100.

In the aforementioned exemplary embodiment, the second slope 140 of the micro lens 180 is mainly described, but the light extracted to the first slope 130 of the micro lens 180 may be extracted to the outside of the substrate 100 through the same or similar process.

As such, in the organic light emitting diode display device according to the exemplary embodiment of the present disclosure, based on the line vertical to the tangent line of the second slope 140 in the light generated from the organic emission element EL, up to the light directed at an angle of −30° to 30° is extracted to the outside of the substrate 100, thereby improving light extraction efficiency.

As described above, in an organic light emitting diode display device according to an exemplary embodiment of the present disclosure, the reflective pattern 120 is disposed in the area corresponding to the recess of the micro lens 180 formed on the overcoating layer 190, thereby reducing reflectivity, reducing or preventing a light leakage phenomenon, and enhancing light extraction efficiency.

Features, structures, effects, and the like described in the aforementioned exemplary embodiments are included in at least one exemplary embodiment of the present disclosure and is not particularly limited to only one exemplary embodiment. Furthermore, the feature, the structure, the effect, and the like exemplified in each exemplary embodiment are combined or modified to be executed even with respect to other exemplary embodiments by those skilled in the art to which the exemplary embodiments pertain. Therefore, it should be construed that contents associated with the combination and modification are included in the scope of the present disclosure.

Further, in the above description, the present disclosure has been described based on the exemplary embodiments, but the exemplary embodiments are for illustrative, and do not limit the present disclosure, and those skilled in the art will appreciate that various modifications and applications, which are not exemplified in the above description, may be made without departing from the scope of the essential characteristic of the present exemplary embodiments. For example, each component described in detail in the embodiment can be modified.

What is claimed is:

1. An organic light emitting diode display device, comprising:
    an overcoating layer on a substrate and including a plurality of micro lenses;
    an organic emission element including a first electrode, an organic emission layer and a second electrode, the organic emission element on the overcoating layer and having a curve according to a shape of the plurality of micro lenses, each of the plurality of micro lenses including a recess and a protrusion;
    a reflective pattern in an area corresponding to the recess, and
    a bank pattern between the overcoating layer and the second electrode,
    wherein the bank pattern defines an emission area and a non-emission area, and
    wherein the plurality of micro lenses are provided in an area corresponding to the emission area.

2. The organic light emitting diode display device of claim 1, wherein recesses of the plurality of micro lenses are spaced apart from each other by protrusions of plurality of micro lenses.

3. The organic light emitting diode display device of claim 2, wherein the recesses and the protrusions are alternately disposed.

4. The organic light emitting diode display device of claim 1, wherein each protrusion includes a slope, and wherein an angle of the slope relative to a horizontal surface of the organic emission element is in a range of 40° to 60° or in a range of 120° to 140°.

5. The organic light emitting diode display device of claim 1, wherein the overcoating layer has at least one opening, the protrusion includes two convex portions spaced apart from each other by the at least one opening, the reflective pattern is disposed in a separation space corresponding to the at least one opening, and wherein the separation space corresponds to the recess.

6. The organic light emitting diode display device of claim 1, further comprising a polarizing plate, wherein the reflective pattern is disposed between the organic emission layer and the polarizing plate.

7. The organic light emitting diode display device of claim 1, wherein refractive indices of the first electrode and the organic emission layer are greater than refractive indices of the overcoating layer and the substrate.

8. The organic light emitting diode display device of claim 1, wherein the emission layer transmits an emission light, and wherein the emission light is incident on a polarizing plate and is reflected by the polarizing plate to generate a reflection light, and wherein the reflective pattern is located on a path of the reflection light.

9. The organic light emitting diode display device of claim 1, wherein the protrusion includes two convex portions, a width of the reflective pattern is smaller than a distance between two centers of the two convex portions.

10. The organic light emitting diode display device of claim 1, wherein a width of the reflective pattern is smaller than a distance between two centers of two of the recesses that are immediately adjacent to each other.

11. The organic light emitting diode display device of claim 1, wherein the reflective pattern is disposed between the overcoating layer and the substrate.

12. The organic light emitting diode display device of claim 1, wherein in the area corresponding to the recess, the reflective pattern is disposed on a color filter layer, wherein the color filter layer is disposed on the substrate or an insulating layer, and wherein the insulating layer is disposed on a thin film transistor disposed on the substrate.

13. The organic light emitting diode display device of claim 1, wherein in the area corresponding to the recess, the reflective pattern is disposed between the overcoating layer and the first electrode.

14. The organic light emitting diode display device of claim 1, wherein each of the plurality of micro lenses has a first area corresponding to the recess, a second area corresponding to a wall surrounding the recess, and a third area corresponding to a convex portion of the protrusion, and wherein the reflective pattern is disposed in the area corresponding to the first area.

15. An organic light emitting diode display device, comprising:
- an overcoating layer on a substrate, wherein the overcoating layer has a non-flat surface; and
- an organic emission element including a first electrode, an organic emission layer and a second electrode, the organic emission element on the overcoating layer and having a curve according to a shape of the non-flat surface;
- a reflective pattern between the first electrode and the substrate, and
- a bank pattern between the overcoating layer and the second electrode,
- wherein the bank pattern defines an emission area and a non-emission area, and
- wherein the non-flat surface of the overcoating layer is provided in an area corresponding to the emission area.

16. The organic light emitting diode display device of claim 15, wherein the overcoating layer includes a plurality of micro lenses on the non-flat surface, each of the plurality of micro lenses includes a protrusion and a recess, the overcoating layer has at least one opening, the protrusion includes two convex portions spaced apart from each other by the at least one opening, the reflective pattern is disposed in a separation space corresponding to the at least one opening, and the separation space corresponds to the recess.

17. The organic light emitting diode display device of claim 15, further comprising a polarizing plate, wherein the reflective pattern is disposed between the organic emission layer and the polarizing plate.

18. The organic light emitting diode display device of claim 16, wherein a width of the reflective pattern is smaller than a distance between two centers of the two convex portions.

19. The organic light emitting diode display device of claim 16, wherein a width of the reflective pattern is smaller than a distance between two centers of two of the recesses that are immediately adjacent to each other.

20. The organic light emitting diode display device of claim 15, wherein the overcoating layer includes a plurality of micro lenses on the non-flat surface, each of the plurality of micro lenses includes a recess and a protrusion, the reflective pattern is disposed in an area corresponding to the recess.

21. The organic light emitting diode display device of claim 20, wherein in the area corresponding to the recess, the reflective pattern is disposed on a color filter layer, the color filter layer is disposed on the substrate or an insulating layer, and wherein the insulating layer is disposed on a thin film transistor disposed on the substrate.

* * * * *